United States Patent
Adam et al.

(10) Patent No.: US 9,330,908 B2
(45) Date of Patent: May 3, 2016

(54) SEMICONDUCTOR STRUCTURE WITH ASPECT RATIO TRAPPING CAPABILITIES

(71) Applicant: GLOBALFOUNDRIES INC., Grand Cayman (KY)

(72) Inventors: Thomas N. Adam, Slingerlands, NY (US); Kangguo Cheng, Schenectady, NY (US); Pouya Hashemi, White Plains, NY (US); Ali Khakifirooz, Mountain View, CA (US); Alexander Reznicek, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/925,911

(22) Filed: Jun. 25, 2013

(65) Prior Publication Data

US 2014/0374796 A1    Dec. 25, 2014

(51) Int. Cl.
| | |
|---|---|
| H01L 21/02 | (2006.01) |
| H01L 21/8258 | (2006.01) |
| H01L 21/8238 | (2006.01) |
| H01L 27/088 | (2006.01) |

(52) U.S. Cl.
CPC .... *H01L 21/02538* (2013.01); *H01L 21/02373* (2013.01); *H01L 21/02447* (2013.01); *H01L 21/8258* (2013.01); *H01L 21/823807* (2013.01); *H01L 27/088* (2013.01)

(58) Field of Classification Search
CPC .............. H01L 21/02538; H01L 21/8258; H01L 21/823807; H01L 27/088; H01L 21/02373; H01L 21/02447
See application file for complete search history.

(56) References Cited

U.S. PATENT DOCUMENTS

| | | | |
|---|---|---|---|
| 6,177,688 B1 * | 1/2001 | Linthicum et al. | 257/77 |
| 6,255,198 B1 * | 7/2001 | Linthicum et al. | 438/481 |

(Continued)

FOREIGN PATENT DOCUMENTS

| | | |
|---|---|---|
| JP | 62137871 A | 6/1987 |
| JP | 01090524 A | 4/1989 |

(Continued)

OTHER PUBLICATIONS

Bhattacharya et al., "Designing a new class of III-IV-V semiconductor nanosheets", AIP Conf. Proc., vol. 1512, pp. 850-851, Solid State Physics: Proceedings of the 57th DAE Solid State Physics Symposium 2012, Dec. 3-7, 2012. DOI: http://dx.doi.org/10.1063/1.4791305.

(Continued)

*Primary Examiner* — Matthew Reames
*Assistant Examiner* — Vincent Wall
(74) *Attorney, Agent, or Firm* — Scully Scott Murphy and Presser; Frank DiGiglio

(57) ABSTRACT

A semiconductor structure includes a first semiconductor region. The first semiconductor region includes a first semiconductor layer composed of a group IV semiconductor material having a top surface and a back surface. The first semiconductor layer has an opening in the top surface to at least a depth greater than an aspect ratio trapping (ART) distance. The first semiconductor region also has a second semiconductor layer composed of a group III/V semiconductor compound deposited within the opening and on the top surface of the first semiconductor layer. The second semiconductor layer forms an ART region from the bottom of the opening to the ART distance.

19 Claims, 7 Drawing Sheets

(56) References Cited

U.S. PATENT DOCUMENTS

| | | | |
|---|---|---|---|
| 7,071,087 B2 | 7/2006 | Yang et al. | |
| 7,915,645 B2 | 3/2011 | Briere | |
| 8,173,551 B2 | 5/2012 | Bai et al. | |
| 8,253,211 B2 | 8/2012 | Cheng et al. | |
| 8,274,097 B2 | 9/2012 | Cheng | |
| 2011/0136325 A1 | 6/2011 | Briere | |
| 2012/0256188 A1 | 10/2012 | McDonald et al. | |
| 2012/0256189 A1 | 10/2012 | McDonald et al. | |
| 2013/0105860 A1* | 5/2013 | Lochtefeld et al. | 257/190 |
| 2013/0337637 A1* | 12/2013 | Cheng et al. | 438/478 |

FOREIGN PATENT DOCUMENTS

| | | |
|---|---|---|
| JP | 11163399 A | 6/1999 |
| WO | 2008073529 A2 | 6/2008 |

OTHER PUBLICATIONS

Bolkhovityanov et al., "III-V Compounds-on-Si: Heterostructure Fabrication, Application and Prospects", The Open Nanoscience Journal, 2009, 3, 20-33, 2009 Bentham Open, (Received Mar. 12, 2009, Revised May 4, 2009, Accepted Jun. 17, 2009). http://www.benthamscience.com/open/tonanoj/articles/V003/20TONANOJ.pdf.

Wu et al., Atomic-layer-deposited Al2O3/GaAs metal-oxide-semiconductor field-effect transistor on Si substrate using aspect ratio trapping technique, Birck and NCN Publications, Paper 395, Dec. 15, 2008. (Also published in Applied Physics Letters 93, 242106 (2008), DOI: 10.1063/1.3050466).

* cited by examiner

SEMICONDUCTOR STRUCTURE WITH ASPECT RATIO TRAPPING CAPABILITIES

FIELD

The present invention relates generally to semiconductor structures, and more particularly relates to semiconductor structures made of semiconductors from different elemental groups.

BACKGROUND

Field effect transistors (FETs), which are considered semiconductor devices, have been the dominant semiconductor technology used to make application specific integrated circuit (ASIC) devices, microprocessor devices, static random access memory (SRAM) devices, and the like. In particular, complementary metal oxide semiconductor (CMOS) technology has dominated the semiconductor process industry for a number of years. Typically, silicon is the semiconductor material used in forming FETs due to cost and manufacturability. Technology advances have scaled FETs on semiconductor devices to small dimensions allowing power per logic gate to be dramatically reduced, and further allowing a very large number of FETs to be fabricated on a single semiconductor device. The speed of semiconductor devices has also increased. However, traditional silicon FETs are reaching their physical limitations as their size decreases.

There is an economic need to increase the capabilities of semiconductor devices. Most semiconductor devices are made from silicon, a group IV semiconductor material. Other semiconductor materials such as group III/V semiconductors compounds may provide advantages over group IV semiconductor materials and vice versa. For instance, Germanium (Ge), a group IV semiconductor, is an excellent p-type material for p-type field effect transistors (pFET) due to high hole mobility. However, GaAs, a group III/V semiconductor compound, has higher electron mobility when compared to silicon or germanium and thus is suited for n-type field effect transistors (nFET). In a semiconductor circuit, for example in a complementary metal-oxide semiconductor (CMOS) circuit both nFET and pFET with high performance are desired.

Combining the different groups of semiconductor materials in semiconductor structures will provide a range of performance benefits for various semiconductor devices formed on the semiconductor structures. However, problems arise when layering various semiconductor materials, especially between group III/V and group IV materials. Semiconductors are crystalline materials that have lattice structures. The different semiconductor groups and semiconductors within the same group may have varying lattice constants. When epitaxially growing a semiconductor material with a second lattice constant on a semiconductor material with a first lattice constant, defects may occur. Some of the defects may be threading dislocations. High threading dislocation density, stemming from large lattice mismatch, may render the semiconductor device unusable. Threading dislocations may occur when growing a crystal structure on another crystal structure with a different lattice constant. They are defects within the crystal structure itself.

SUMMARY

One embodiment is directed to a semiconductor structure. The semiconductor structure includes a first semiconductor region. The first semiconductor region includes a first semiconductor layer composed of a first semiconductor material having a first lattice constant having a top surface and a back surface. The first semiconductor layer has an opening in the top surface to at least a depth greater than an aspect ratio trapping (ART) distance. The first semiconductor region also has a second semiconductor layer composed of a second semiconductor material with a second lattice constant deposited within the opening and on the top surface of the first semiconductor layer. The second semiconductor layer forms an ART region from the bottom of the opening to the ART distance.

In another embodiment, a method is described that is directed toward creating a semiconductor structure. The method includes forming a first semiconductor region. The first semiconductor region includes a first semiconductor layer composed of a first semiconductor material having a first lattice constant having a top surface and a back surface. The first semiconductor layer has an opening in the top surface to at least a depth greater than an aspect ratio trapping (ART) distance. Also, a second semiconductor layer composed of a second semiconductor material with a second lattice constant is formed by being deposited within the opening and on the top surface of the first semiconductor layer. The second semiconductor layer forms an ART region from the bottom of the opening to the ART distance.

BRIEF DESCRIPTION OF THE DRAWINGS

Embodiments are illustrated by way of example, and not by way of limitation, in the figures of the accompanying drawings in which reference numerals refer to similar elements.

DETAILED DESCRIPTION

Figure 1:
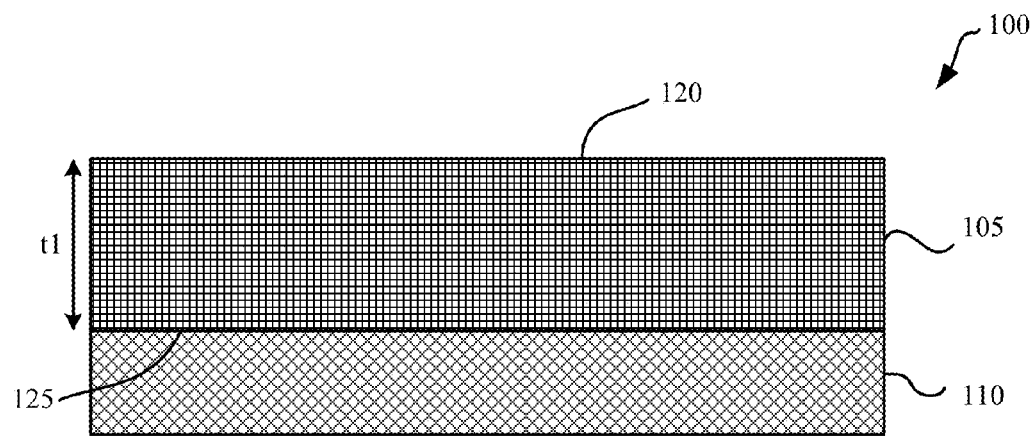
FIG. 1 illustrates a stage of an exemplary manufacturing process of an exemplary semiconductor structure, according to an embodiment.

Embodiments herein provide for a semiconductor structure formed with aspect ratio trapping and a method of making thereof. Features illustrated in the drawings are not necessarily drawn to scale. Descriptions of well-known components and processing techniques are omitted so as to not unnecessarily obscure the disclosed embodiments. The descriptions of embodiments are provided by way of example only, and are not intended to limit the scope of the invention as claimed. The same numbers may be used in the Figures and the Detailed Description to refer to the same devices, parts, components, steps, operations, and the like.

Embodiments herein provide for a semiconductor structure having multiple semiconductor materials with lattice mismatch. By using a technique of aspect ratio trapping, threading dislocations from growing a first semiconductor material on second semiconductor material may be trapped by sidewalls of a trapping material. Aspect ratio trapping may allow for the formation of a defect free region of first semiconductor material. As used herein "aspect ratio trapping" (ART) refers generally to a technique of causing defects to terminate at sidewalls of a structure where the sidewalls are sufficiently high relative to the size of an ART region so as to trap most, if not all, of the defects. The ART region may be the area between the sidewalls of the structure that contains the defects. The ART region may vary due to the type of material, its crystal structure, and other variables.

FIGS. 1, 8, 2, 3, and 4 show sequential views of exemplary manufacturing stages of an exemplary semiconductor structure, according to an embodiment. Referring now to FIG. 1, a semiconductor structure 100 is illustrated, according to an embodiment. The manufacturing stages to obtain the final semiconductor structure may begin with semiconductor structure 100. Semiconductor structure 100 may have a first semiconductor layer 105 and a third semiconductor layer 110 (a second semiconductor layer 305 is discussed later in FIG. 3). The first semiconductor layer 105 may have a top surface 120 and a back surface 125 with a thickness (t1) between the front and back surfaces 125. Thickness t1 may range from 0.05 μm-5 μm. The first semiconductor layer 105 may be of a group IV semiconductor material. In an embodiment, the first semiconductor layer 105 may be Germanium (Ge). However, other group IV semiconductor elements and compounds may be used such as, but not limited to, silicon (Si), silicon germanium (SiGe), and silicon carbide (SiC). High percentage Ge compounds such as SiGe (i.e. 80%-90% Ge) may make up the first semiconductor layer. In other embodiments, a strained group IV material may be used to make up the first semiconductor layer 105.

In an embodiment, the third semiconductor layer 110 may be a silicon wafer or other group IV semiconductor elements and compounds previously listed. The third semiconductor layer 110 may be coupled to the first semiconductor layer 105 at the back end of the first semiconductor layer 105. In other embodiments, the third semiconductor layer 110 may be omitted and the semiconductor structure 100 may be a bulk group IV semiconductor element or compound of the first semiconductor layer 105. In other embodiments, the semiconductor structure 100 may be a semiconductor-on-insulator (SOI) substrate. For illustrative purposes, the semiconductor structure 100 may have a Ge first semiconductor layer 105 and a Si third semiconductor layer 110 herein.

Figure 8:
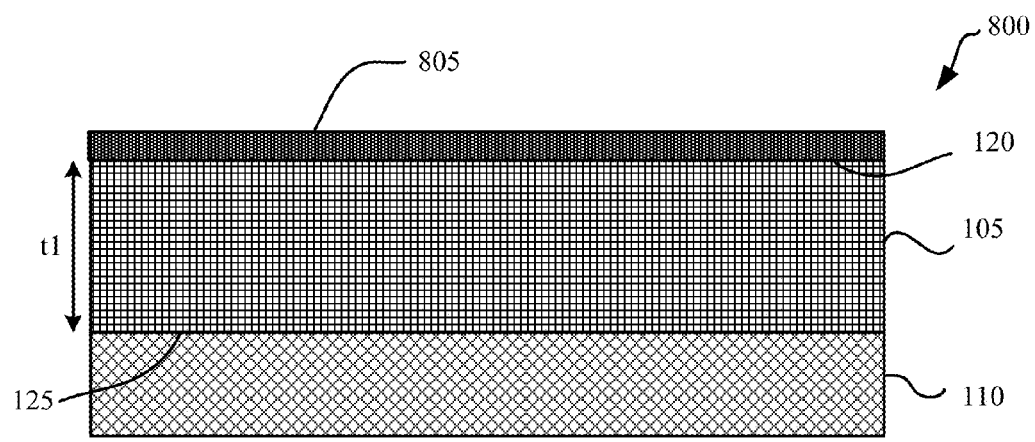
FIG. 8 illustrates a stage of the exemplary manufacturing process of FIG. 1, according to an embodiment.

Referring now to FIG. 8 a semiconductor structure 800 is illustrated after a manufacturing step of semiconductor structure 100 (FIG. 1). An insulator layer 805 may be added to the top surface 120 of the first semiconductor 105 layer of semiconductor structure 100. Semiconductor structure 100 may now be referred to as semiconductor structure 150. The insulator layer 805 may be any dielectric such as, but not limited to, $SiO_2$ and $HfO_2$.

Figure 2:
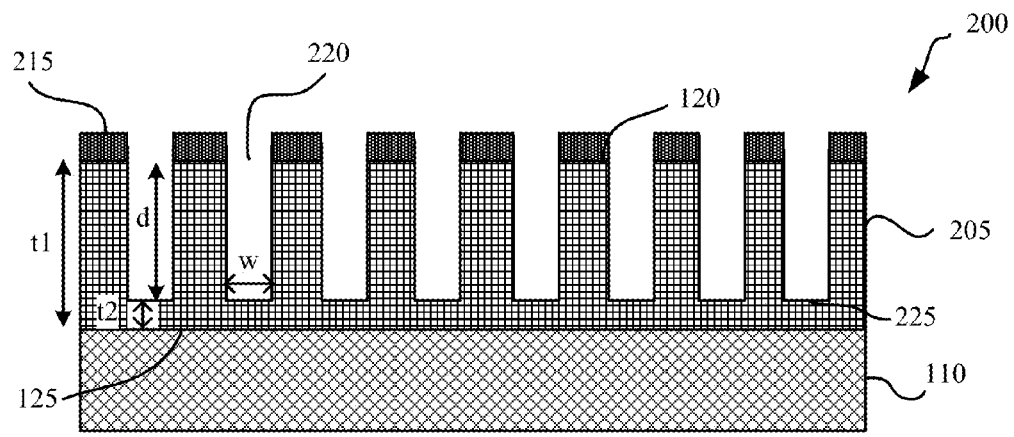
FIG. 2 illustrates a stage of the exemplary manufacturing process of FIG. 1, according to an embodiment.

Referring now to FIG. 2, a semiconductor structure 200 is illustrated after a manufacturing step of semiconductor structure 150 (FIG. 8), according to an embodiment. A portion of the insulator layer 805 (FIG. 8) and a portion of the first semiconductor layer 105 may be removed forming one or more openings 220, cap 215, a bottom surface 225 of the opening 220 and first semiconductor layer 205 (modified first semiconductor 105). This may be done by a selective etch process. Cap 215 is the remaining insulator layer 805 on the first semiconductor layer 205 after the selective etch.

The opening 220 may be substantially rectangular in terms of its cross-sectional profile, a top view, or both. The opening 220 may have a depth (d) of 0.05 μm-5 μm, for illustration purposes. The depth d may be less than the thickness (t1) of the first semiconductor layer 205 but greater than an ART distance (H) (discussed later below in FIG. 3) necessary to trap crystal defects such as threading dislocations when a second semiconductor layer 305 (FIG. 3) is deposited in the opening 220. The opening 220 may have a first width (w) that may be less than about 500 nm, e.g., about 10-100 nm, for example. The length (not shown) may exceed each of w and d. The width and depth of the opening 220 may be of a ratio that is able trap defects of the second semiconductor layer 305 in the opening 220. A ratio of the depth d of the opening 220 to the width w of the opening 220 may be ≥0.5, and in some embodiments, ≥1.

Figure 3:
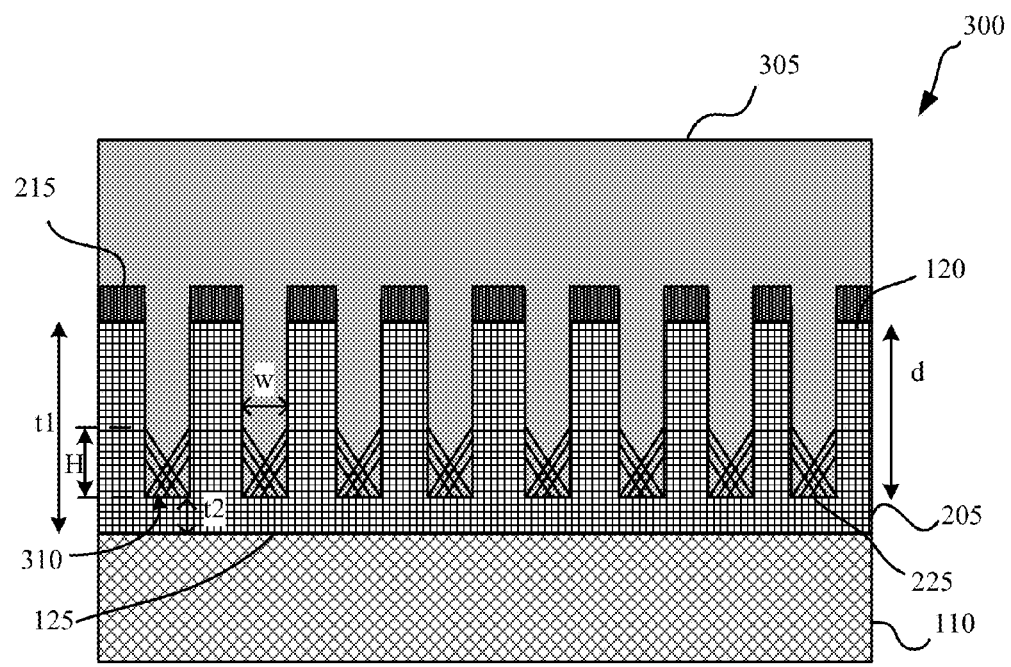
FIG. 3 illustrates a stage of the exemplary manufacturing process of FIG. 1, according to an embodiment.

Referring now to FIG. 3, semiconductor structure 300 is an illustration after a processing step is performed to semiconductor structure 200 of FIG. 2. The processing step includes epitaxially growing a second semiconductor layer 305 from the bottom surface 225 of the opening 220 of the first semiconductor layer 205 with a bottom-up fashion, i.e. no nucleation of the semiconductor layer 305 occurs on the sidewalls of the opening 220. FIG. 3 illustrates the second semiconductor layer 305 may fill the openings 220 (FIG. 2) in the first semiconductor layer 205. The second semiconductor layer 305 may also overfill the opening 220 to cover the surfaces of the caps 215.

The second semiconductor layer 305 may be a group III/V semiconductor compound. In an embodiment, the second semiconductor layer 305 may be GaAs. However other group III/V semiconductor compounds may be used such as, but not limited to, GaP, GaSb, GaN, InP, InAs, InN, InSb, AN, AlAs, AlSb, AlP and/or their ternary or quaternary compounds. The second semiconductor layer may be formed by epitaxial growth in any suitable epitaxial deposition system, including, but not limited to, Metal-organic chemical vapor deposition (MOCVD) atmospheric pressure CVD (APCVD, reduced-pressure CVD (LPCVD), ultra-high-vacuum CVD (UHVCVD) molecular beam epitaxy (MVE), or atomic layer deposition (ALD).

As the second semiconductor layer 305 is being grown, defects 310 such as threading dislocations in the second semiconductor layer 305 reach and terminate at the sidewalls of the opening 220 in the first semiconductor layer 205. The defects 310 terminate at or below the vertical predetermined ART distance H from the surface of the first semiconductor layer 205 that forms the end of the opening 220. The second semiconductor layer 305 may be smoothed by a chemical-mechanical planarization (CMP) process if needed. The area where the defects are contained by ART may be called the ART region and is defined by the length of opening, the ART distance H, and the width w of the opening 220.

Figure 4:
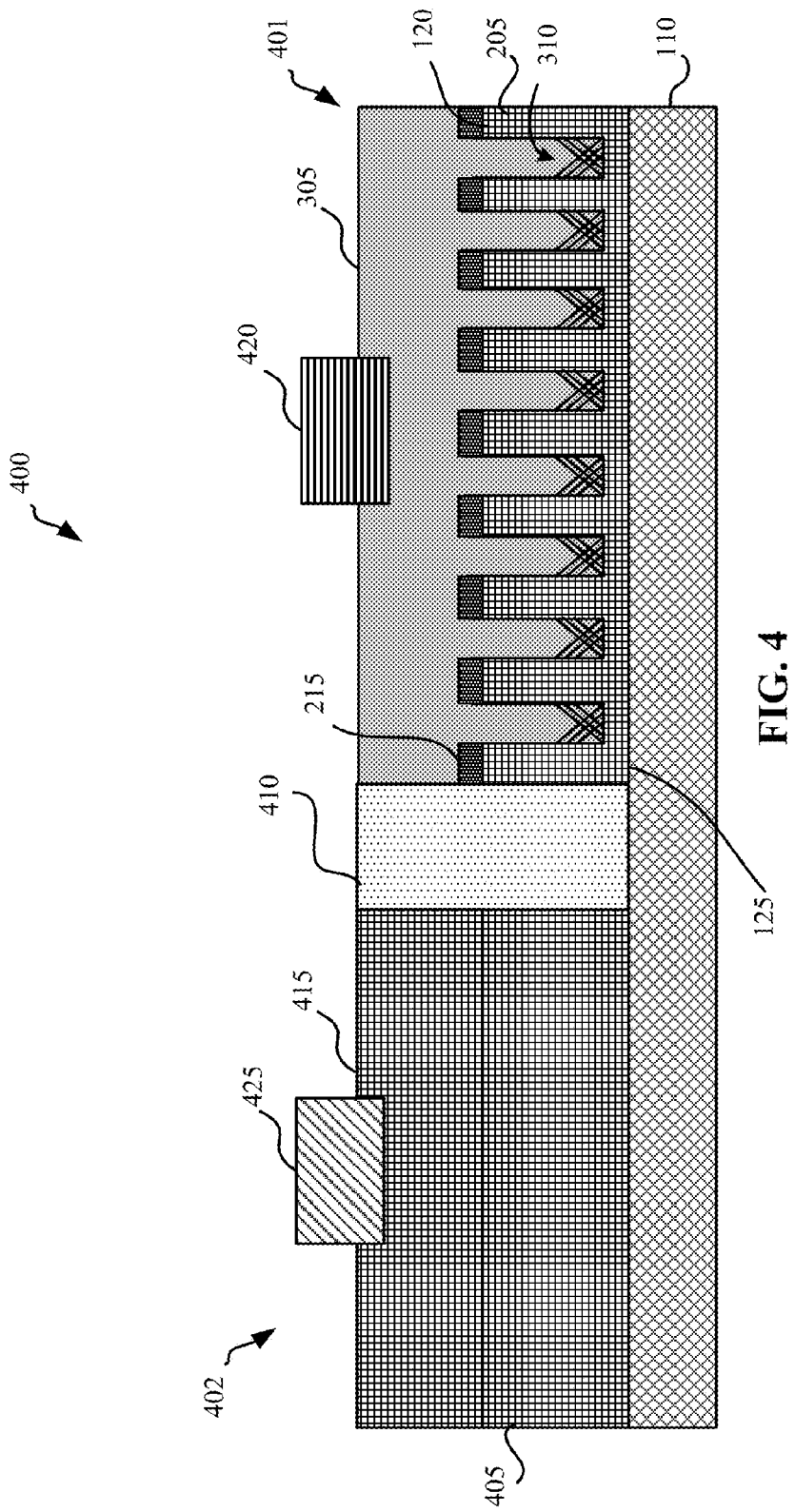
FIG. 4 illustrates a stage of the exemplary manufacturing process of FIG. 1, according to an embodiment.

FIG. 4 illustrates a semiconductor structure 400 after performing a manufacturing step to the semiconductor structure 300 of FIG. 3. Semiconductor structure 400 may include an intact first semiconductor layer 405, an insulator 410, a fourth semiconductor layer 415, a first semiconductor device 420, and a second semiconductor device 425. The intact first semiconductor layer 405 may be the same as the first semiconductor layer 105 of FIG. 1 without performing the manufacturing step of etching the openings 220 and epitaxial growth of the second semiconductor layer 305. An additional fourth semiconductor layer 415 may be formed on the intact first semiconductor layer 405. The fourth semiconductor layer 415 may be formed from the same group IV material as the intact first semiconductor layer 405. The fourth semiconductor layer 415 may be optionally epitaxially grown, if desired for topography reasons. For example, if the second semiconductor layer is Ge then the fourth semiconductor layer may be Ge.

The insulator 410 may form an electrical barrier between the intact first and fourth semiconductor layers 405 and 415 and the first and second semiconductor layers 205 and 305. This may define a first semiconductor region 401 and a second semiconductor region 402. The first semiconductor layer 205 and the second semiconductor layer 305 may make up the first semiconductor region 401. The intact first semiconductor layer 405 and the fourth semiconductor layer 415 may make up the second semiconductor region 402. A first semiconductor device 420 may be located on the second semiconductor layer 305 of the first semiconductor region 401. For example, an n-type field effect transistor (nFET), finFET, or nano-wire may be the first semiconductor device 420. Since the second semiconductor layer 305 may be a group III/V material, it may have high electron mobility increasing performance for nFETs. A second semiconductor device 425 may be located on the fourth semiconductor layer 415 of the second semiconductor region 402. For example, a p-type field effect transistor (pFET) may be the second semiconductor device 425. Since the fourth semiconductor layer 415 may be a group IV material, such as Ge, it may have high hole mobility increasing performance for pFETs. In another embodiment, the fourth semiconductor layer 415 may not be grown and the second semiconductor device may be located on the intact first semiconductor layer 405.

Figure 5:
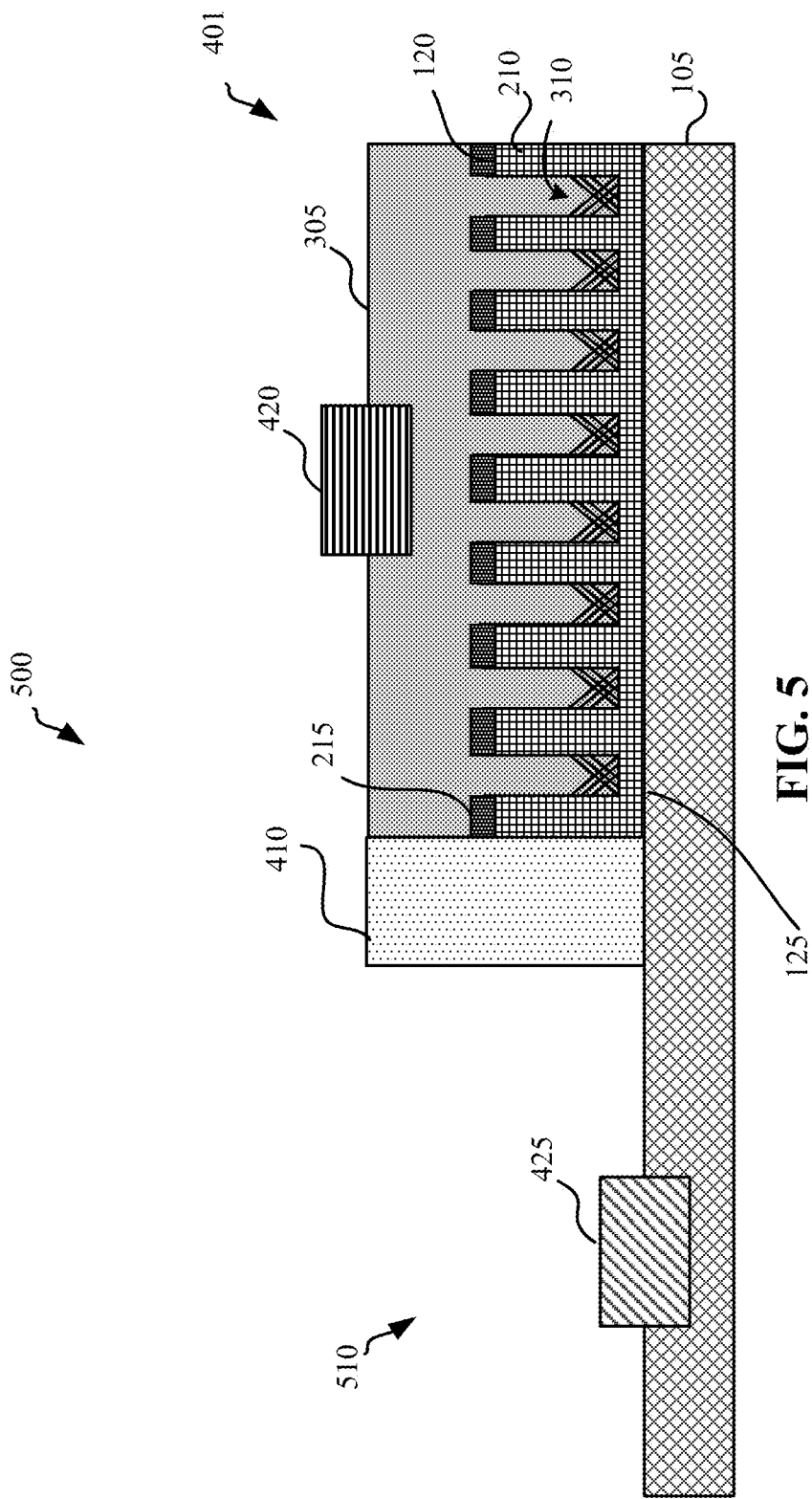
FIG. 5 illustrates an alternative embodiment of the semiconductor structure of FIG. 4, according to an embodiment.

In FIG. 5, a semiconductor structure 500 is illustrated, according to an embodiment. The semiconductor structure 500 may include the first semiconductor region 401 and a second semiconductor region 510. In this embodiment, the intact first semiconductor layer 405 (FIG. 4) may be omitted and the second semiconductor device 425 may be located on the third semiconductor layer 105.

Figure 6:
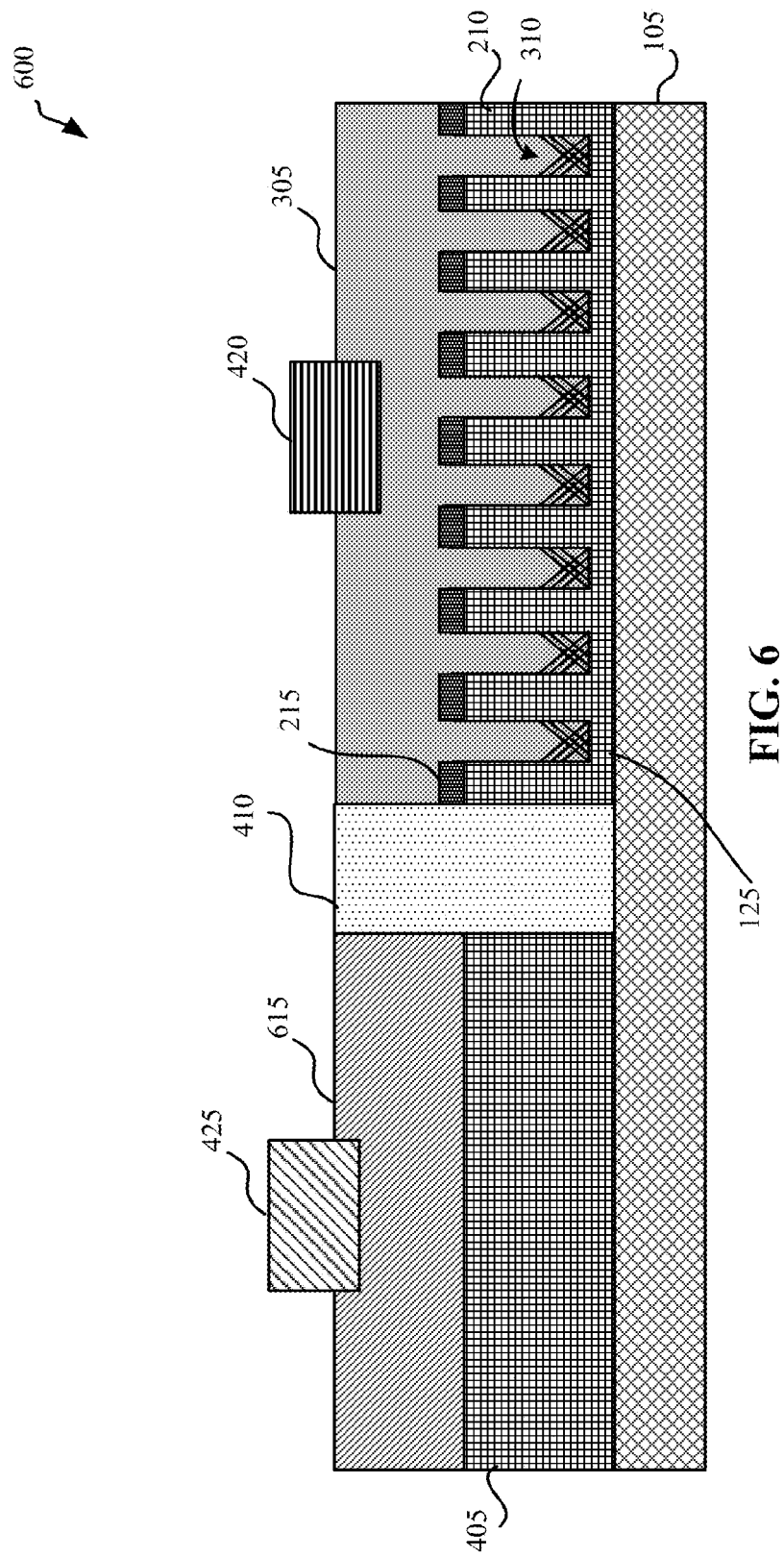
FIG. 6 illustrates an alternative embodiment of the semiconductor structure of FIG. 4, according to an embodiment.

In FIG. 6, a semiconductor structure 600 is illustrated, according to an embodiment. In this embodiment, a fourth semiconductor layer 615 may be formed. The fourth semiconductor layer 615 may be a group IV material that is different from the group IV element or compound of the intact first semiconductor layer 405 and the fourth semiconductor layer 415 (FIG. 4) such as, but not limited to, silicon (Si), silicon germanium (SiGe), and silicon carbide (SiC). The fourth semiconductor layer 615 may be a compressively strained group IV element or a high percentage Ge compound such as SiGe (i.e. 80% Ge or 90% Ge). The second semiconductor device 425 may be located on the fourth semiconductor layer 615.

Figure 7:
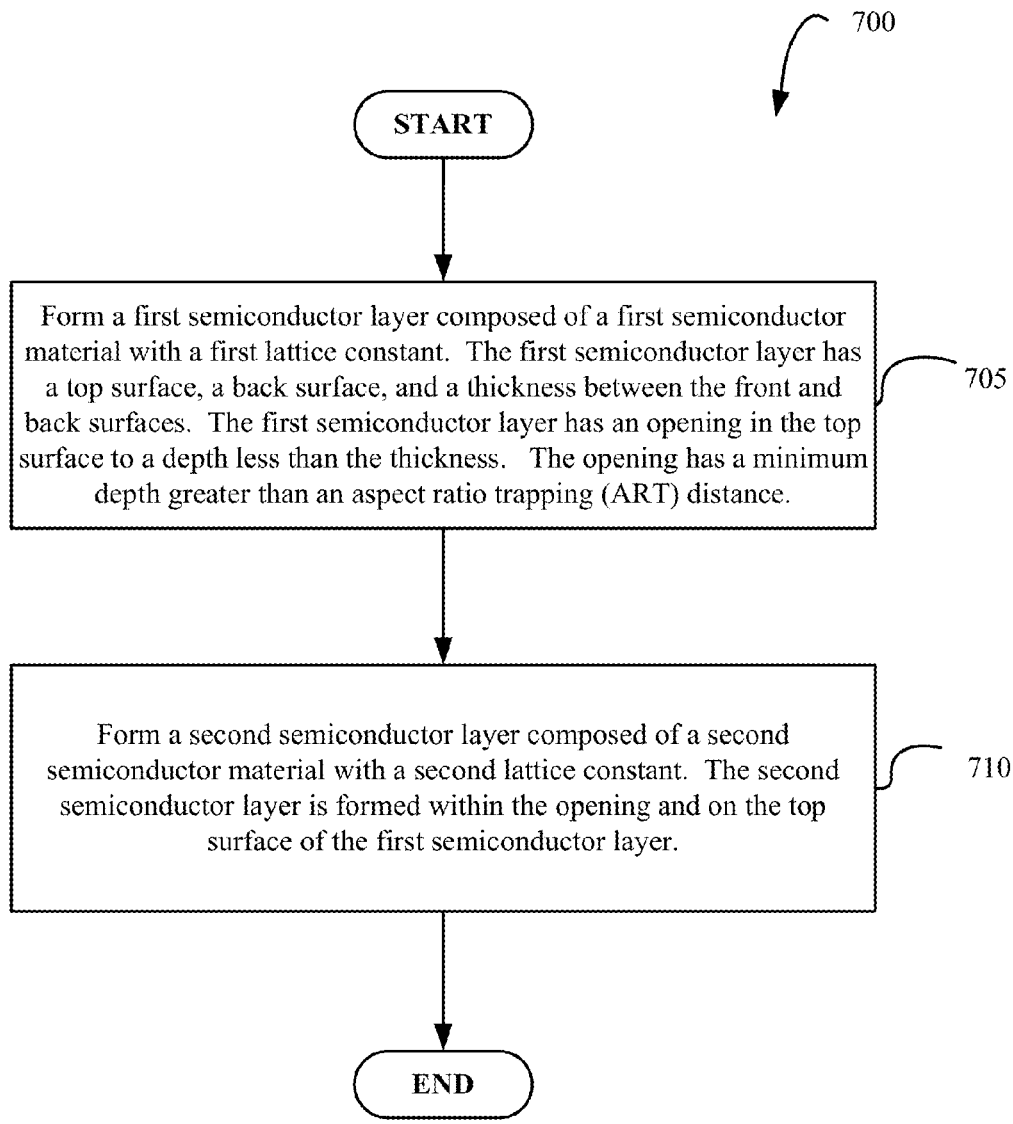
FIG. 7 is a flow chart of a method of making the semiconductor structure, according to an embodiment.

FIG. 7 illustrates a method 700 of creating a semiconductor structure with a first semiconductor region, according to an embodiment. In operation 705, a first semiconductor layer composed of a first semiconductor material with a first lattice constant is formed. The first semiconductor layer has a top surface, a back surface, and a thickness between the front and back surfaces. The first semiconductor layer has an opening in the top surface to a depth less than the thickness. The opening has a minimum depth greater than an aspect ratio trapping (ART) distance.

In operation 710, a second semiconductor layer is formed. The second semiconductor layer is composed of a second semiconductor material with a second lattice constant. The second semiconductor layer is formed within the opening and on the top surface of the first semiconductor layer.

Figure 9:
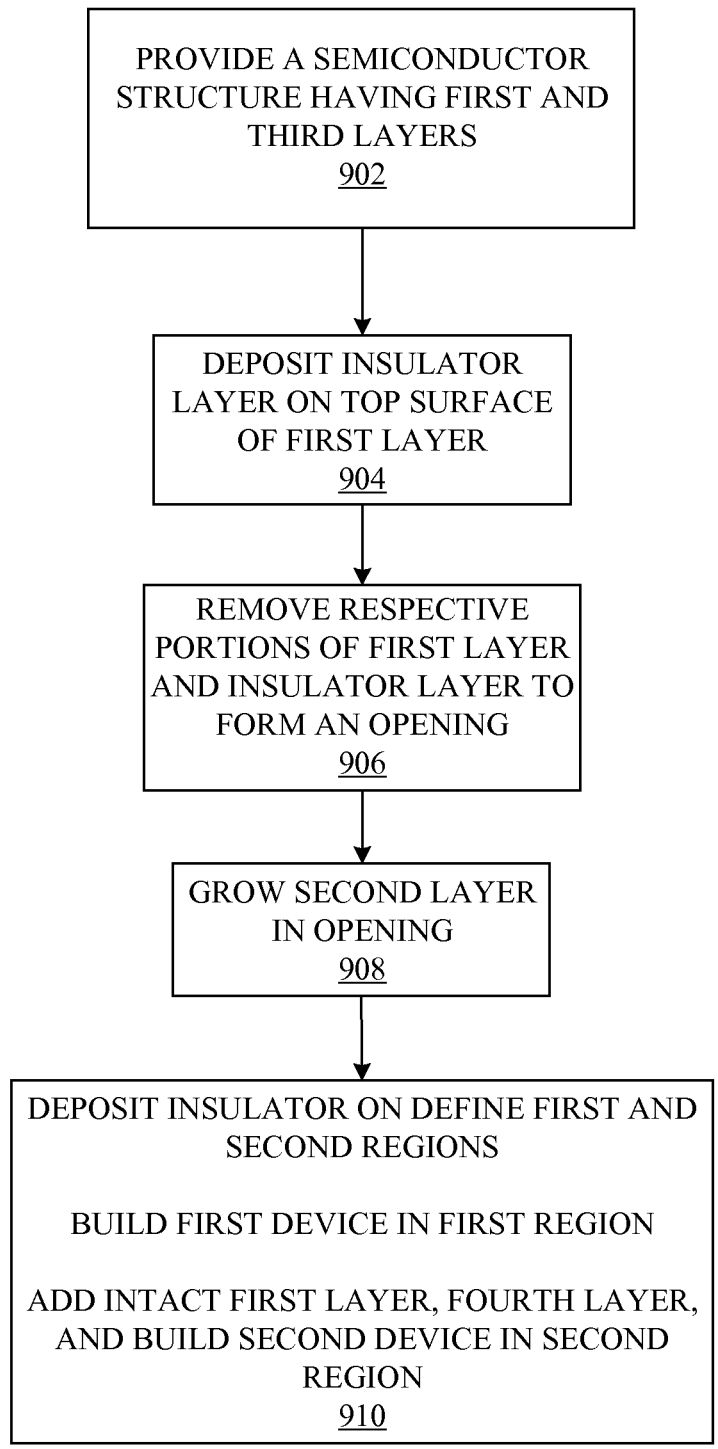
FIG. 9 illustrates various stages of a process for manufacturing a semiconductor according to various embodiments.

FIG. 9 illustrates various stages of a process for manufacturing a semiconductor according to various embodiments. In manufacturing step 902, a semiconductor structure 100 is provided as previously described with respect to FIG. 1. The semiconductor structure 100 may have a first semiconductor layer 105 and a third semiconductor layer 110. The first semiconductor layer 105 may have a top surface 120 and a back surface 125 with a thickness (t1) between the front and back surfaces 125. Thickness t1 may range from 0.05 μm-5 μm. The first semiconductor layer 105 may be of a group IV semiconductor material. In an embodiment, the first semiconductor layer 105 may be Germanium (Ge). However, other group IV semiconductor elements and compounds may be used as previously described. The third semiconductor layer 110 may be a silicon wafer or other group IV semiconductor elements and compounds as previously described.

In manufacturing step 904, an insulator layer 805 may be added to the top surface 120 of the first semiconductor 105 layer of semiconductor structure 100 as previously described with respect to FIG. 8. The insulator layer 805 may be any dielectric such as, but not limited to, $SiO_2$ and $HfO_2$.

In manufacturing step 906, a portion of the insulator layer 805 (FIG. 8) and a portion of the first semiconductor layer 105 may be removed forming one or more openings 220, cap 215, a bottom surface 225 of the opening 220 and first semiconductor layer 205 (modified first semiconductor 105), as previously described with respect to FIG. 2. This may be done by a selective etch process.

In manufacturing step 908, a second semiconductor layer 305 may be epitaxially grown from the bottom surface 225 of the opening 220 of the first semiconductor layer 205 with a bottom-up fashion, i.e. no nucleation of the semiconductor layer 305 occurs on the sidewalls of the opening 220, as previously described with respect to FIG. 3. The second semiconductor layer 305 may be a group III/V semiconductor compound. In an embodiment, the second semiconductor layer 305 may be GaAs. However other group III/V semiconductor compounds may be used as previously described. As previously described, defects 310, such as threading dislocations, in the second semiconductor layer 305 reach and terminate at the sidewalls of the opening 220 in the first semiconductor layer 205. The defects 310 terminate at or below the vertical predetermined ART distance H from the surface of the first semiconductor layer 205 that forms the end of the opening 220. The manufacturing step 908 may include smoothing the second semiconductor layer 305 by a chemical-mechanical planarization (CMP) process.

A manufacturing step 910 includes adding an insulator 410 to define a first semiconductor region 401 and a second semiconductor region 402, as previously described with respect to FIG. 4. In addition, the manufacturing step 910 includes adding an intact first semiconductor layer 405, a fourth semiconductor layer 415, a first semiconductor device 420, and a second semiconductor device 425, as shown in FIG. 4. The insulator 410 and intact first semiconductor layer 405 may be added on the third semiconductor layer 110, as shown in FIG. 4. As shown in FIGS. 4, 5, and 6 the insulator extends vertically from the third semiconductor layer 110 to a surface of the second semiconductor layer 305 opposite to the back surface 125 of the first semiconductor layer 205. The intact first semiconductor layer 405 may be the same as the first semiconductor layer 105 of FIG. 1 without performing the manufacturing step of etching the openings 220 and epitaxial growing of the second semiconductor layer 305. In the manufacturing step 910, an additional fourth semiconductor layer 415 may be formed on the intact first semiconductor layer 405. The fourth semiconductor layer 415 may be formed from the same group IV material as the intact first semiconductor layer 405. The fourth semiconductor layer 415 may be optionally epitaxially grown, if desired for topography reasons. The insulator 410 forms an electrical barrier between the intact first and fourth semiconductor layers 405 and 415 and the first and second semiconductor layers 205 and 305.

In an alternative embodiment, the manufacturing step 910 includes locating the second semiconductor device 425 on the third semiconductor layer 105 as shown in FIG. 5. The intact first semiconductor layer 405 shown in FIG. 4 may be omitted.

In another alternative embodiment, the manufacturing step 910 includes forming a fourth semiconductor layer 615 from a group IV material that is different from the group IV element or compound of the intact first semiconductor layer 405 as described above with respect to FIG. 6. This alternative may include locating the second semiconductor device 425 on the fourth semiconductor layer 615.

While embodiments have been described with reference to the details of the embodiments shown in the drawings, these details are not intended to limit the scope of the invention as claimed in the appended claims.

What is claimed is:

1. A method of creating a semiconductor structure, comprising:
   forming a first semiconductor region, the forming of the first semiconductor region comprising:
      providing a semiconductor structure having a first semiconductor layer formed on a first portion of a third semiconductor layer, the first semiconductor layer including a first semiconductor material and having a top surface and a bottom surface, wherein the first semiconductor material includes a group IV semiconductor material;
      depositing a first insulator layer on the top surface of the first semiconductor layer;
      removing respective portions of the first insulator layer and the first semiconductor material to form an opening, the opening having a depth and a sidewall, wherein the depth of the opening is located between the top surface and the bottom surface of the first semiconductor layer;
      forming a second semiconductor layer in the opening and on the top surface of a remaining portion of the first insulator layer, the second semiconductor layer is formed upward from an exposed sub-surface of the first semiconductor layer provided by the opening and including a second semiconductor material, the first and second semiconductor materials having different lattice constants, and wherein the forming of the second semiconductor layer includes forming defects in the second semiconductor layer that terminate at a lower portion of the first semiconductor material along the sidewall of the opening that are located at distance from the top surface of the first insulator layer that is less than the depth of the opening.

2. The method of claim 1, wherein the third semiconductor layer includes a group IV semiconductor material.

3. The method of claim 1, further comprising building a first semiconductor device on the second semiconductor layer.

4. The method of claim 3, wherein the first semiconductor device is an n-type field effect transistor.

5. The method of claim 1, further comprising depositing a second insulator on a second portion of the third semiconductor layer to define a second semiconductor region on a third portion of the third semiconductor layer, the second insulator layer extending vertically from the third semiconductor layer to a surface of the second semiconductor layer opposite to the bottom surface of the first semiconductor layer, the second semiconductor region being electrically isolated from the first semiconductor region, the second semiconductor region including a fifth semiconductor layer, the fifth semiconductor layer including the first semiconductor material.

6. The method of claim 5, further comprising building a second semiconductor device on the fifth semiconductor layer.

7. The method of claim 6, wherein the second semiconductor device is a p-type field effect transistor (pFET).

8. The method of claim 5, further comprising depositing a fourth semiconductor layer on the fifth semiconductor layer, the fourth semiconductor layer including a fourth semiconductor material.

9. The method of claim 8, further comprising building a second semiconductor device on the intact fourth semiconductor layer.

10. The method of claim 8, wherein fourth semiconductor material includes a same group IV semiconductor material as the first semiconductor material.

11. The method of claim 8, wherein the fourth semiconductor material includes a different group IV semiconductor material from the first semiconductor material.

12. The method of claim 1, further comprising depositing a second insulator on a second portion of the third semiconductor layer to define a second semiconductor region on a third portion of the third semiconductor layer, the second insulator extending vertically from the third semiconductor layer to a surface of the second semiconductor layer opposite to the back surface of the first semiconductor layer, the second semiconductor region being electrically isolated from the first semiconductor region, wherein a first semiconductor device is formed on the second semiconductor layer in the first semiconductor region and a second semiconductor device is formed on the third semiconductor layer in the second semiconductor region.

13. The method of claim 9, wherein the second semiconductor device is a p-type field effect transistor (pFET).

14. The method of claim 12, wherein the first semiconductor device is an n-type field effect transistor (nFET) and the second semiconductor device is a p-type field effect transistor (pFET).

15. The method of claim 1, wherein the second semiconductor material includes a group III/V semiconductor material.

16. A method of creating a semiconductor structure, comprising:
    forming a first semiconductor region, the forming of the first semiconductor region comprising:
       providing a semiconductor structure having a first semiconductor layer formed on a first portion of a third semiconductor layer, the first semiconductor layer including a first semiconductor material and having a top surface and a bottom surface;
       depositing a first insulator layer on the top surface of the first semiconductor layer;
       removing respective portions of the first insulator layer and the first semiconductor material to form an opening, the opening having a depth and a sidewall;
       forming a second semiconductor layer in the opening and on the top surface of the first insulator layer, the second semiconductor layer is formed upward from an exposed sub-surface of the first semiconductor layer provided by the opening and including a second semiconductor material, the first and second semiconductor materials having different lattice constants, and wherein the forming of the second semiconductor layer includes forming defects in the second semiconductor layer that terminate at a lower portion of the first semiconductor material along the sidewall of the opening that are located at distance from the top surface of the first insulator layer that is less than the depth of the opening, and forming a second semiconductor region, the forming the second semiconductor region comprising:
depositing a second insulator on a second portion of the third semiconductor layer to define a second semiconductor region on a third portion of the third semiconductor layer, the second insulator layer extending vertically from the third semiconductor layer to a surface of the second semiconductor layer opposite to the bottom surface of the first semiconductor layer, the second semiconductor region being electrically isolated from the first semiconductor region, the second semiconductor region including a fifth semiconductor layer, the fifth semiconductor layer including the first semiconductor material, wherein the first semiconductor material is a group IV semiconductor material and the second semiconductor material is selected from a III-V semiconductor material and a group IV semiconductor material.

17. The method of claim 16, wherein the first semiconductor material includes a group IV semiconductor material and the second semiconductor material includes a group III/V semiconductor material.

18. The method of claim 16, further comprising building a first semiconductor device on the second semiconductor layer in the first semiconductor region and building a second semiconductor device in the second semiconductor region.

19. The method of claim 18, wherein the first semiconductor device is an n-type field effect transistor (nFET) and the second semiconductor device is a p-type field effect transistor (pFET).

* * * * *